United States Patent [19]

Makino et al.

[11] Patent Number: 4,645,688

[45] Date of Patent: Feb. 24, 1987

[54] COMPOSITION FOR PROTECTIVE COATING MATERIAL

[75] Inventors: Daisuke Makino; Hidetaka Sato; Hiroshi Suzuki; Shun-ichiro Uchimura, all of Hitachi; Hiroshi Suzuki, Shimodate, all of Japan

[73] Assignee: Hitachi Chemical Company, Ltd., Tokyo, Japan

[21] Appl. No.: 679,460

[22] Filed: Dec. 7, 1984

Related U.S. Application Data

[60] Division of Ser. No. 568,284, Jan. 5, 1984, Pat. No. 4,511,705, which is a continuation of Ser. No. 366,146, Apr. 7, 1982, abandoned.

[30] Foreign Application Priority Data

Apr. 14, 1981 [JP] Japan ................................ 56-56538

[51] Int. Cl.$^4$ .............................................. B05D 5/12
[52] U.S. Cl. ...................................... 427/82; 528/26; 528/38; 357/72
[58] Field of Search ...................... 528/26, 38; 357/72; 427/82

[56] References Cited

U.S. PATENT DOCUMENTS

| | | | |
|---|---|---|---|
| 3,740,305 | 6/1973 | Hoback et al. | 528/21 |
| 4,017,340 | 4/1977 | Yerman | 528/26 |
| 4,030,948 | 6/1977 | Berger | 528/26 |
| 4,051,163 | 9/1977 | Berger | 528/26 |
| 4,511,705 | 4/1985 | Makino et al. | 528/26 |

*Primary Examiner*—Melvin I. Marquis
*Attorney, Agent, or Firm*—Frishauf, Holtz, Goodman & Woodward

[57] ABSTRACT

There are disclosed a composition for protective coating material, preferably for a protective coating material of a semiconductor device which is constituted of principal elements of a semiconductor memory element, an encapsulating layer containing an inorganic material for encapsulating said element and a layer of a cured protective coating material arranged between said memory element and said encapsulating layer, which is composed of a polyamide acid obtained by the reaction of a diaminosiloxane, an organic diamine containing no silicon and an organic tetrabasic acid dianhydride, and a semiconductor device having a layer of a cured protective coating material composed of a polyimide-silicone copolymer obtained by dehydrating ring closure of the above-mentioned polyamide acid.

22 Claims, No Drawings

COMPOSITION FOR PROTECTIVE COATING MATERIAL

This is a division of Ser. No. 568,284 filed Jan. 5, 1984 issued as U.S. Pat. No. 4,511,705, on Apr. 16, 1985, which, in turn, is a continuation of Ser. No. 366,146 filed Apr. 7, 1982 now abandoned.

This invention relates to a composition for protective coating material, preferably a protective coating material for a semiconductor having a high degree of integration. More particularly, this invention relates to a composition for coating material of a semiconductor which is constituted of principal elements of a semiconductor memory element, an encapsulating layer containing an inorganic material for encapsulating the element and a layer of a protective coating material arranged between the memory element and the encapsulating layer.

When α-ray enters a semiconductor memory element having a high degree of integration, inversion of information 0→1, 1→0 occurs to cause so called soft errors, as is recently clarified. Such an α-ray is radiated from uranium, thorium, etc. as a primary source contained in an inorganic filler contained in a ceramic case or a thermosetting resin encapsulating the element. Accordingly, various attempts have been made to reduce the content of uranium and thorium by purification of these materials. But, it is a technically difficult problem which has not yet been solved.

On the other hand, soft errors can be prevented by consideration of the circuit design of a semiconductor element, but the chip area may disadvantageously be increased, and it has not put to practical application except for special examples.

In this regard, as is well known, organic materials are generally lower in content of uranium, thorium, etc. which are sources of α-ray than inorganic materials and, even if they may be contained, the contents of uranium, thorium, etc. can be reduced with relative ease by purification operations of the constituent materials by distillation, recrystallization, reprecipitation of materials, etc. Further, organic materials have the action of absorbing α-ray. Thus, soft errors of elements have attempted to be prevented by formation of an organic layer between an encapsulating layer and a semiconductor element thereby to absorb α-ray in the organic layer and such an attempt is now at the stage of practical application. Semiconductor memory elements are encapsulated with a ceramic or a thermosetting resin in order to ensure humidity resistance, the encapsulating temperature being 350° to 450° C. in case of the former, while the resin is cured by heating at about 200° C. in case of the latter. Therefore, organic materials for absorption of α-ray must have characteristics which can sufficiently stand these heat treatment temperatures, and as organic materials for this purpose, polyimide type resins are primarily used. However, polyimide type resins are generally very poor in ion to passivation films used in semiconductor memory elements such as of those made of silicon oxide, silicon nitride, etc. In order to ensure adhesiveness, it is indispensable to use a coupling agent such as a silane type or a organic chelate of a metal. So long as such polyimide type resins in general are employed, the step of forming a coupling agent layer is indispensable but makes the process complicated. Moreover, by use of an organic chelate of a metal as a coupling agent, it is very difficult to remove α-ray source contained in an inorganic material, as mentioned above, thus giving a danger of new α-ray source. A silane type coupling agent has a decomposition temperature of 300° to 350° C. and therefore it cannot stand the encapsulating temperature of a ceramic.

An object of the present invention is to provide a composition for protective coating material of a semiconductor device which does not cause erroneous actuation (soft error) by incidence of α-ray from outside of the semiconductor device.

Another object of the present invention is to provide a composition for protective coating material of a semiconductor device which is excellent in adhesiveness to passivation films and has heat resistance enough to stand the heat treatment temperature at the time of encapsulation.

The present invention relates to a composition for protective coating material which contains a polyamide acid comprising 0.1 to 20 mole % of the recurring unit represented by the formula (1) and 80 to 99.9 mole % of the recurring unit represented by the formula (2) obtained by the reaction of a diaminosiloxane, an organic diamine containing no silicon and an organic tetrabasic acid dianhydride:

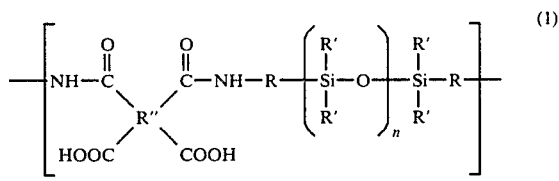

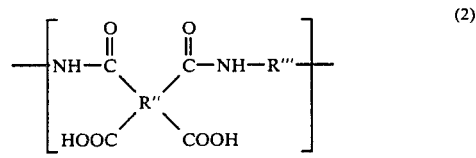

wherein R is a divalent hydrocarbyl group; R' is a monovalent hydrocarbyl group; R" is a tetravalent organic group; R''' is a divalent organic group which is a residue of an organic diamine containing no silicon; and n an integer of 1 or more.

The composition according to this invention may preferably be used as a composition for a protective coating of a semiconductor device which is constituted of principal elements of a semiconductor memory element, an encapsulating layer containing an inorganic material for encapsulating said element and a layer of a protective coating material arranged between said memory element and said encapsulating layer.

The group R may preferably be an alkylene group having 1 to 5 carbon atoms (e.g., methylene, ethylene, propylene, butylene), a phenylene or an alkyl-substituted phenylene group (e.g., methyl-substituted phenylene), while R' may preferably be an alkyl group having 1 to 5 carbon atoms (e.g., methyl, ethyl, propyl, butyl), or a phenyl group.

The groups R's or R"s in the above formula (1) may be the same or different.

One example of a method for preparation of a polyamide acid comprising the recurring units represented by the above formula (1) and the recurring units of the above formula (2) is described in Japanese Patent Publication No. 27439/1968. That is, an organic diamine containing no silicon, a diaminosiloxane and an organic tetrabasic acid dianhydride are allowed to react in a solvent to form a polyamide acid. This is then heated at a temperature of 150° C. to 350° C. or higher to effect dehydrating ring closure to give a polyimide-silicone copolymer comprising the recurring units of the formulas (3) and (4) shown below:

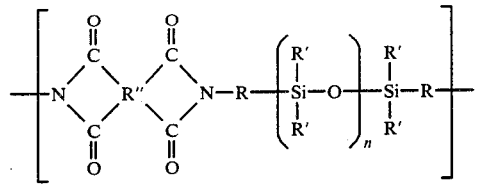
(3)

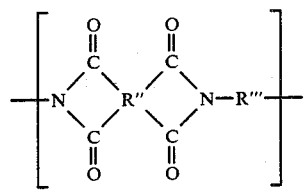
(4)

wherein R, R', R", R'" and n are the same as defined above.

In the present invention, the recurring units represented by the above formula (1) are in the range of from 0.1 to 20 mole %, preferably 0.2 to 10 mole % and the recurring units represented by the formula (2) in the range of from 80 to 99.9 mole %, preferably 90 to 99.8 mole %, and they can be controlled within said ranges by reacting a diaminosiloxane in the range of from 0.1 to 20 mole % and an organic diamine containing no silicon in the range of from 80 to 99.9 mole %.

As organic diamines containing no silicon to be used as monomeric compounds in the present invention, there may be included, for example, 4,4'-diaminodiphenylether, 4,4'-diaminodiphenylmethane, 4,4'-diaminodiphenylsulfone, 4,4'-diaminodiphenylsulfide, benzidine, m-phenylenediamine, p-phenylenediamine, 1,5-naphthalenediamine, 2,6-naphthalenediamine, etc. These compounds may be used either as a single species or as a mixture of two or more species.

As the diaminosiloxane, there may be used a compound represented by the formula:

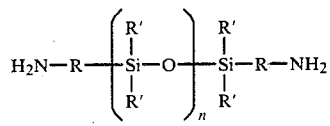

wherein R, R' and n are the same as defined above.

For example, the following compounds may be included:

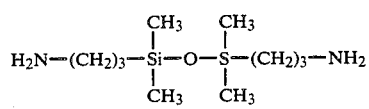

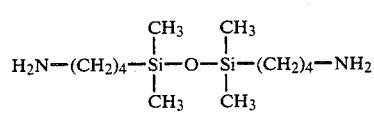

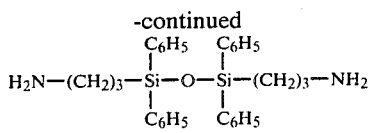

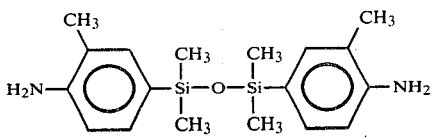

These compounds may be used as a single species or as a mixture of two or more species.

The organic tetrabasic acid dianhydrides may include, for example, pyromellitic acid dianhydride, 3,3',4,4'-diphenyltetracarboxylic acid dianhydride, 3,3',4,4'-benzophenonetetracarboxylic acid dianhydride, cyclopentanetetracarboxylic acid dianhydride, 1,2,5,6-naphthalenetetracarboxylic acid dianhydride, 2,3,6,7-naphthalenetetracarboxylic acid dianhydride, 2,3,5,6-pyridinetetracarboxylic acid dianhydride, 1,4,5,8-naphthalenetetracarboxylic acid dianhydride, 3,4,9,10-perylenetetracarboxylic acid dianhydride or 4,4'-sulfonyldiphthalic acid dianhydride, and so on. These may be used either as a single species or a combination of two or more species.

In the preparation of the polyamide acid from the above monomeric compounds, there is employed an inert solvent. As a solvent particularly preferred, there may be used one which can dissolve the polyamide acid formed. For example, there may be one kind or two or more kinds of N-methyl-2-pyrrolidone, N,N-dimethylacetamide, N,N-dimethylformamide, N,N-diethylformamide, dimethyl sulfoxide, hexamethylphosphoramide, tetramethylenesulfone, etc.

Thus, the composition according to this invention may ordinarily contain a solvent which was employed for preparing the polyamide acid from the above-mentioned monomeric compounds.

Synthesis of the polyamide acid may be performed by dissolving as thoroughly as possible the organic diamine containing no silicon, the diaminosiloxane and the organic tetrabasic acid dianhydride in the aforesaid inert solvent, and then stirring the reaction system while maintaining the system desirably at about 80° C. or lower, especially around room temperature or lower. By such operations, the reaction can proceed rapidly with gradual increase in viscosity of the reaction system until the polyamide acid is formed. The composition containing the inert solvent used in the reaction can be used as such as a composition for protective coating material.

In preparing a polyamide acid from the aforesaid monomeric compounds, in order to obtain the best heat resistance, it is preferred to use an organic tetrabasic acid dianhydride in an amount equimolar to the total amount of an organic diamine containing no silicon and a diaminosiloxane.

The composition for protective coating material of a semiconductor device according to the present invention may preferably contain 1 ppb or less, more preferably 0.2 ppb or less of uranium and thorium as the total content. This is because the influence of α-ray radiated from the protective coating material on the soft error of the element is reduced abruptly at the borderline of 0.2 to 1 ppb. The total content of uranium and thorium can be reduced to 1 ppb or less, preferably to 0.2 ppb or less by purification of the aforesaid monomeric compounds or a solvent.

Purification of monomeric compounds may be conducted according to the so called recrystallization method, wherein the monomeric compounds are dissolved by heating in a suitable solvent, subjected to filtration and then the filtrate is cooled to precipitate the monomeric compounds, under the conditions which are not paticularly limited. Purification of a solvent may be conducted by distillation.

In the polyamide acid according to the present invention, the ratio of the recurring units represented by the above formula (1) occupied in the whole copolymer is 0.1 to 20 mole %. This is because a copolymer with a content of the above recurring units of less than 0.1 mole % has poor adhesiveness to a semiconductor element and it is required to use a coupling agent in order to ensure adhesiveness, whereby the object of the present invention cannot be attained. On the other hand, with increase in the content of the above recurring units, heat resistance of the copolymer is lowered until, at a level exceeding 20 mole %, the temperature at which the weight reduction commences becomes 350° C. or lower and the copolymer cannot stand the heat treatment applied at the time of encapsulation of an encapsulating layer.

The composition for a protective coating material according to the present invention is coated and subjected to dehydrating ring closure to be converted to a polyimide-silicone copolymer. It may have a thickness preferably of 30 μm or more, more preferably 40 μm or more, in order to exhibit a preferable shielding effect against α-ray.

The encapsulating layer may be constituted of a ceramic package, a metal package such as metallic cans, or a resin package such as an epoxy resin mold, etc.

The composition for the protective coating material according to the present invention exhibits more effective action in a highly integrated semiconductor memory element. More specifically, it is effective for a semiconductor memory element having a degree of integration of 1K bit or more in case of bipolar type and 16K bit or more in case of MIS type.

Thus, this invention also provides an excellent semiconductor device being constituted of principal elements of a semiconductor memory element, an encapsulating layer containing an inorganic material for encapsulating said element and a layer of a protective coating material arranged between said memory element and said encapsulating layer, when said protective coating is composed of a polyimide-silicon copolymer comprising 0.1 to 20 mole % of the recurring unit represented by the above-mentioned formula (3) and 80 to 99.9 mole % of the recurring unit represented by the above-mentioned formula (4). The protective coating for the semiconductor device may be prepared by applying the above-mentioned composition to the memory element and by subjecting it to dehydrating ring closure to convert the above-mentioned polyamide into the polyimide-silicon copolymer.

The present invention is illustrated in detail below by referring to Examples.

EXAMPLE 1

The reaction of 9.0 g of 4,4'-diaminodiphenylether recrystallized by use of n-butanol as a solvent, 1.2 g of 1,3-bis(aminopropyl)-tetramethyldisiloxane purified by distillation under reduced pressure and 10.9 g of pyromellitic acid dianhydride recrystallized by use of acetic acid anhydride was carried out in 119.6 g of N-methyl-2-pyrrolidone purified by distillation under reduced pressure to prepare a polyamide acid solution with a resin content of 14.5% by weight and a viscosity of 125 poise (10 mole % of the recurring units represented by the formula (1) and 90 mole % of the recurring units represented by the formula (2)). After removal of the solvent from the polyamide acid solution, the contents of uranium and thorium were examined by radiochemical analysis to be less than the detectable limits of 0.002 ppb and 0.05 ppb, respectively.

As the next step, the polyamide acid solution was coated on the surface of a MOS type RAM with a degree of integration of 16K bit, and heat treatment was applied at 100° C. for 2 hours, at 200° C. for one hour and at 350° C. for one hour to form a protective coating layer of a polyimide-silicone copolymer having a thickness of about 40 μm.

Then, the above product was encapsulated in a ceramic package with a metal cap fused at about 380° C. using a gold-tin system seal material.

The semiconductor device was found to have a soft error rate of 30 fit.

Next, a naked element with no application of a ceramic package was left to stand in a steam at 120° C. under 2.2 atm. for 20 hours, and thereafter Cellophane tape peel-off test was conducted, whereby no peel-off between the protective coating layer and the semiconductor element was observed, thus indicating a high degree of adhesiveness.

COMPARATIVE EXAMPLE 1

The reaction of 10.0 g of 4,4'-diaminodiphenylether purified similarly as in Example 1 and 10.9 g of pyromellitic acid dianhydride was carried out in 118.4 g of N-methyl-2-pyrrolidone purified by distillation to prepare a polyamide acid solution with a resin content of 14.7% by weight and a viscosity of 135 poise.

As the next step, on the same memory element as used in Example 1 coated on its surface with a 1 wt. % solution of ethyl acetoacetate aluminumdiisopropylate in toluene and treated at 350° C. for one hour to form a coupling agent layer with a thickness of about 200 Å, the above polyamide acid solution was coated, followed by the heat treatment under the same conditions as in Example 1, to form a protective coating layer of polyimide having a thickness of 45 μm.

Following subsequently the procedure similar to Example 1, encapsulation was effected and the soft error rate of the semiconductor device was measured to be 250 fit. The uranium content in the coupling agent layer was found to be 0.3 ppb and that in the polyimide film less than 0.02 ppb.

EXPERIMENTAL EXAMPLE 1

A polyimide film was formed in the same manner as in Comparative example 1 except that no coupling agent layer was formed. The composite was left to stand in a steam at 120° C. under 2.2 atm. for one hour and thereafter Cellophane tape peel-off test was conducted. As the result, the polyimide film was peeled off from the element.

EXPERIMENTAL EXAMPLE 2

With the same formulation as used in the synthesis of the polyamide acid solution in Example 1, but using unpurified materials, the reaction was carried out to prepare a polyamide acid solution with a resin content of 14.7% by weight and a viscosity of 15 poise.

As the next step, the polyamide acid solution was coated on the same memory element as used in Example 1, followed by heat treatment at 100° C. for one hour and at 200° C. for one hour, and thereafter the solution was coated once again thereon, followed by the heat treatment under the same conditions. This procedure was further repeated once and thereafter heat treatment conducted at 350° C. to form a coating layer of a polyimide-silicone copolymer with a film thickness of 35 μm.

Then, encapsulation was effected similarly as in Example 1 and the soft error rate was measured to be 900 fit. The uranium content in the polyimide-silicone copolymer was found to be 0.2 ppb and the thorium content 0.1 ppb.

The soft error rate of a semiconductor device only encapsulated in a ceramic package was found to be $6.5 \times 10^4$ fit.

EXAMPLE 2

The reaction of 9.8 g of 4,4'-diaminodiphenylether purified similarly as in Example 1, 0.25 g of 1,3-bis-(aminopropyl)-tetramethyldisiloxane and 10.9 g of pyromellitic acid dianhydride was carried out in 119 g of purified N-methyl-2-pyrrolidone to prepare a polyamide acid solution with a resin content of 14.5% by weight and a viscosity of 150 poise (2 mole % of the recurring units represented by the formula (1) and 98 mole % of the recurring units represented by the formula (2)). The polyamide acid solution was coated and cured on the same memory element as used in Example 1 to form a polyimide-silicone copolymer coating of 50 μm. The coated product was encapsulated in a ceramic package using a low melting glass as fusing material at about 450° C.

The soft error rate of the resultant semiconductor device was found to be 25 fit. The uranium content in the above copolymer was less than 0.02 ppb and thorium content less than 0.05 ppb.

EXAMPLE 3

The reaction of 5.0 g of 4,4'-diaminodiphenylether purified similarly as in Example 1, 0.6 g of 1,3-bis-(aminopropyl)-tetramethyldisiloxane and 10.9 g of pyromellitic acid dianhydride was carried out in 66 g of purified N-methyl-2-pyrrolidone to prepare a polyamide acid solution with a resin content of 20.2% by weight and a viscosity of 60 poise.

The solution was coated on a bipolar type memory element with a degree of integration of 1K bit, followed by heat treatment at 100° C. for 2 hours and at 200° C. for one hour, and thereafter coated again, followed by heat treatment at 100° C. for 2 hours, at 200° C. for one hour and at 350° C. for one hour, to obtain a memory element having a coating of a polyimide-silicone copolymer with a film thickness of 35 μm.

The memory element was encapsulated in a phenol cure type epoxy molding material, and the soft error ratio was measured to be 30 fit.

The composition for a protective coating material of a semiconductor device according to the present invention can be prepared without use of a coupling agent in combination, and the protective coating prepared therefrom can shield the α-ray radiated from the encapsulated layer to have a great effect in prevention of erroneous actuation of a semiconductor memory element, thereby improving reliability of the element to a great extent.

We claim:

1. A method of protecting a semiconductor memory element of a semiconductor device, said device comprising said element, a layer containing an inorganic material encapsulating said element and a protective coating layer arranged between said element and said encapsulating layer, said method comprising coating said element with a protective coating layer comprising a polyamide acid having from 0.1 to 20 mole % of the recurring unit represented by formula (1) and 80 to 99.9 mole % of the recurring unit represented by formula (2), said polyamide acid being obtained by the reaction of a diaminosilocane, an organic diamine containing no silicon and an organic tetrabasic acid dianhydride in the presence of an inert solvent,

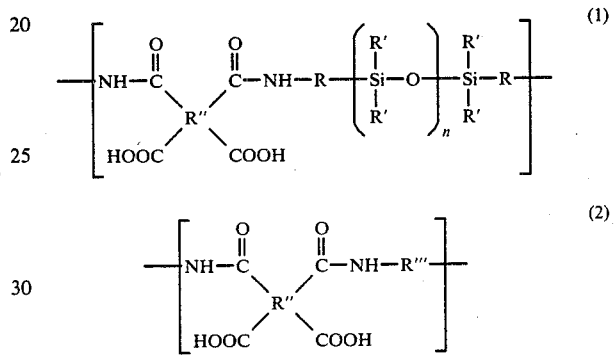

wherein R is a divalent hydrocarbyl group; R' is a monovalent hydrocarbyl group; R'' is a tetravalent organic group; R''' is a divalent organic group which is a residue of an organic diamine containing no silicon; and n is an integer of 1 or more;
and wherein said composition contains a combined amount of uranium and thorium of less than 1 part per billion.

2. The method according to claim 1, wherein R is selected from the group consisting of an alkylene group having 1 to 5 carbon atoms, a phenylene group and a phenylene group substituted with an alkyl group and R' is selected from the group consisting of an alkyl group having 1 to 5 carbon atoms and a phenyl group.

3. The method according to claim 1, wherein R''' is a divalent organic group which is a residue of at least one organic diamine compound selected from the group consisting of 4,4'-diaminodiphenylether, 4,4-diaminodiphenylmethane, 4,4'-diaminodiphenylsulfone, 4,4'-diaminophenylsulfide, benzidine, m-phenylenediamine, p-phenylenediamine, 1,5-naphthalenediamine, 2,6-naphthalenediamine.

4. The method according to claim 1, wherein the combined amount of uranium and thorium is obtained by treating said reactants and solvent to remove uranium and thorium prior to the reaction to form said polyamide acid.

5. The method according to claim 1, wherein said organic tetrabasic acid dianhydride is present in an equimolar amount of the combined amount of said organic diamine and diaminosiloxane.

6. The method according to claim 1, wherein the recurring units of formula (1) are present in an amount of from 0.2 to 10 mole % and the recurring units of formula (2) are present in an amount of from 90 to 99.8 mole %.

7. The method according to claim 1, wherein the combined amount of uranium and thorium is less than 0.2 part per billion.

8. The method according to claim 7, wherein
R is selected from the group consisting of an alkylene group having 1 to 5 carbon atoms, a phenylene group and a phenylene group substituted with an alkyl group and R' is selected from the group consisting of an alkyl group having 1 to 5 carbon atoms and a phenyl group; and
R''' is a divalent organic group which is a residue of at least one organic diamine compound selected from the group consisting of 4,4'-diaminodiphenylether, 4,4-diaminodiphenylmethane, 4,4'-diaminodiphenylsulfone, 4,4'-diaminodiphenylsulfide, benzidine, m-phenylenediamine, p-phenylenediamine, 1,5-naphthalenediamine, 2,6-naphthalenediamine.

9. The method according to claim 8, wherein said organic tetrabasic acid dianhydride is present in an equimolar amount to the combined amount of sad organic diamine and diaminosiloxane.

10. The method according to claim 9, wherein the recurring units of formula (1) are present in an amount of from 0.2 to 10 mole % and the recurring units of formula (2) are present in an amount of from 90 to 99.8 mole %.

11. The method according to claim 10, wherein the combined amount of uranium and thorium is obtained by treating said reactants and solvent to remove uranium and thorium prior to the reaction to form said polyamide acid.

12. A semiconductor device comprising the principal elements of a semiconductor memory element, an encapsulating layer containing an inorganic material encapsulating said element and a layer of a protective coating material between said memory element and said encapsulating layer,
said protective coating comprising a polyamide acid having from 0.1 to 20 mole % of the recurring unit represented by formula (1) and 80 to 99.9 mole % of the recurring unit represented by formula (1) and 80 to 99.9 mole % of the recurring unit represented by formula (2), said polyamide acid being obtained by the reaction of a diaminosiloxane, an organic diamine containing no silicon and an organic tetrabasic acid dianhydride in the presence of an inert solvent,

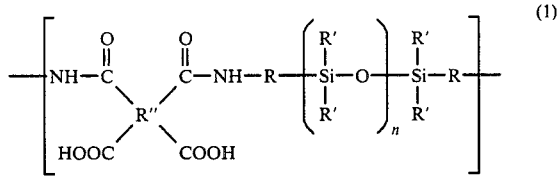

(1)

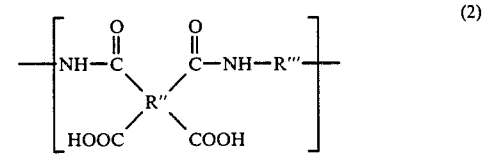

(2)

wherein R is a divalent hydrocarbyl group; R' is a monovalent hydrocarbyl group; R'' is a tetravalent organic group; R''' is a divalent organic group which is a residue of an organic diamine containing no silicon; and n is an integer of 1 or more;
and wherein said composition contains a combined amount of uranium and thorium of less than 1 part per billion.

13. The semiconductor device according to claim 12, wherein R is selected from the group consisting of an alkylene group having 1 to 5 carbon atoms, a phenylene group and a phenylene group substituted with an alkyl group and R' is selected from the group consisting of an alkyl group having 1 to 5 carbon atoms and a phenyl group.

14. The semiconductor device according to claim 12, wherein R''' is a divalent organic group which is a residue of at least one organic diamine compound selected from the group consisting of 4,4'-diaminodiphenylether, 4,4-diaminodiphenylmethane, 4,4'-diaminodiphenylsulfone, 4,4'-diaminodiphenylsulfide, benzidine, m-phenylenediamine, p-phenylenediamine, 1,5-naphthalenediamine, 2,6-naphthalenediamine.

15. The semiconductor device according to claim 12, wherein the combined amount of uranium and thorium is obtained by treating said reactants and solvents to remove uranium and thorium prior to the reaction to form said polyamide acid.

16. The semiconductor device according to claim 12, wherein said organic tetrabasic acid dianhydride is present in an equimolar amount to the combined amount of said organic diamine and diaminosiloxane.

17. The semiconductor device according to claim 12, wherein the recurring units of formula (1) are present in an amount of from 0.2 to 10 mole % and the recurring units of formula (2) are present in an amount of from 90 to 99.8 mole %.

18. The semiconductor device according to claim 12, wherein the combined amount of uranium and thorium is less than 0.2 part per billion.

19. The semiconductor device according to claim 18, wherein
R is selected from the group consisting of an alkylene group having 1 to 5 carbon atoms, a phenylene group and a phenylene group substituted with an alkyl group and R' is selected from the group consisting of an alkyl group having 1 to 5 carbon atoms and a phenyl group, and
R''' is a divalent organic group which is a residue of at least one organic diamine compound selected from the group consisting of 4,4'-diaminodiphenylether, 4,4-diaminodiphenylmethane, 4,4'-diaminophenylsulfone, 4,4'-diaminophenylsulfide, benzidine, m-phenylenediamine, p-phenylenediamine, 1,5-naphthalenediamine, 2,6-naphthalenediamine.

20. The semiconductor device according to claim 19, wherein said organic tetrabasic acid dianhydride is present in an equimolar amount of the combined amount of said organic diamine and diaminosiloxane.

21. The semiconductor device according to claim 20, wherein the recurring units of formula (1) are present in an amount of from 0.2 to 10 mole % and the recurring units of formula (2) are present in an amount of from 90 to 99.8 mole %.

22. The semiconductor device according to claim 21, wherein the combined amount of uranium and thorium is obtained by treating said reactants and solvent to remove uranium and thorium prior to the reaction to form said polyamide acid.

* * * * *